(12) United States Patent
Imai et al.

(10) Patent No.: US 7,880,389 B2
(45) Date of Patent: Feb. 1, 2011

(54) LED LIGHTING LAMP

(75) Inventors: Sadato Imai, Fujiyoshida (JP);
Masayoshi Kanamori, Fujiyoshida (JP)

(73) Assignee: Citizen Electronics Co., Ltd., Yamanashi (JP)

(*) Notice: Subject to any disclaimer, the term of this patent is extended or adjusted under 35 U.S.C. 154(b) by 114 days.

(21) Appl. No.: 11/911,595

(22) PCT Filed: Apr. 13, 2006

(86) PCT No.: PCT/JP2006/307835
§ 371 (c)(1),
(2), (4) Date: Jan. 26, 2009

(87) PCT Pub. No.: WO2006/112355
PCT Pub. Date: Oct. 26, 2006

(65) Prior Publication Data
US 2009/0160302 A1 Jun. 25, 2009

(30) Foreign Application Priority Data
Apr. 14, 2005 (JP) .............................. 2005-117614

(51) Int. Cl.
*H01J 61/30* (2006.01)
*H01J 61/00* (2006.01)
(52) U.S. Cl. ...................... 313/623; 313/504; 362/362; 362/367
(58) Field of Classification Search ................ 313/623, 313/504; 362/362, 367
See application file for complete search history.

(56) References Cited

U.S. PATENT DOCUMENTS

| 5,688,042 A | * | 11/1997 | Madadi et al. | ............... 362/240 |
| 6,335,548 B1 | * | 1/2002 | Roberts et al. | ................ 257/98 |
| 6,621,222 B1 | * | 9/2003 | Hong | ........................... 315/51 |
| 2003/0210556 A1 | * | 11/2003 | Wu et al. | ..................... 362/555 |

FOREIGN PATENT DOCUMENTS

| JP | 11-025604 | 2/1999 |
| JP | 2000-078559 | 3/2000 |
| JP | 2002-198733 | 7/2002 |
| JP | 2002-306428 | 10/2002 |
| JP | 2003-096284 | 3/2003 |
| JP | 2003-325528 | 9/2003 |
| JP | 2004039594 A * | 2/2004 |

* cited by examiner

*Primary Examiner*—Bumsuk Won
*Assistant Examiner*—Nathaniel J Lee
(74) *Attorney, Agent, or Firm*—Browdy and Neimark, PLLC

(57) ABSTRACT

The present invention is an LED lighting lamp which comprises a lamp body including a light emitting part in which a plurality of LED elements are arranged on each of side surfaces of a polygonal supporting member and a connection part which is provided at a different position from that of the light emitting part and is formed with a plurality of terminal electrodes electrically connected to the LED elements, and a socket in which the connection part of the lamp body is fitted and which has a pair of output terminals electrically connected to the terminal electrodes, and which is configured to enhance reliability and long-term stability and reduce a cost involved in exchanging a light source.

6 Claims, 8 Drawing Sheets

LED LIGHTING LAMP

TECHNICAL FIELD

The present invention relates to an LED lighting lamp using a plurality of light emitting diode elements as a light source.

BACKGROUND ART

A fluorescent-lamp-shaped LED lamp in which a plurality of light emitting diodes instead of a fluorescent light source are attached to a ready-made-fluorescent-lamp lighting appliance is disclosed as an example of a conventional LED lighting lamp (for reference, see Patent Document 1). A vehicle-mounted-signal lamp fitting which uses a plurality of light emitting diodes as a light source is also known (for reference, see Patent Document 2). Each of the fluorescent-lamp-shaped LED lamp and the vehicle-mounted-signal lamp fitting in such conventional art usually has a structure in which a plurality of light emitting diodes 93 are mounted on one board 94, as shown in FIG. 12. For the board 94, a glass-epoxy-resinous board is usually used. The board 94 has an upper surface with conductive patterns printed on it to form a lighting circuit. Each of the light emitting diodes 93 includes leads 93a and lead-insertion holes 94a which are provided in the board 94 for insertion of the leads 93a therein, and is mounted on the board 94 by fixing each lead to the board by solder 93b.

However, in the conventional-fluorescent-lamp-shaped LED lamp and the conventional-vehicle-mounted-signal lamp fitting, because the plurality of light emitting diodes 93 are fixed one by one to the board 94 heating value increases for soldering the light emitting diodes. Heat generated by soldering is transmitted to the light emitting diodes through the leads 93a, and therefore, a possibility arises that the light emitting diodes 93 are thermally damaged; thus lowering reliability as a lighting lamp. Moreover, there is a problem that when the lighting lamp has high power, thermal capacity of the light emitting diodes is inevitably increased, and heat necessary for soldering the light emitting diodes is absorbed by the high-heat-capacity light emitting diodes, that makes it difficult to solder the diodes. Furthermore, because the light emitting diodes are fixed by soldering, there is a problem that removal of damaged light emitting diodes needs troublesome and time-consuming operations, and therefore, exchange of its whole fitting is needed, instead of just exchanging the light emitting diodes, resulting in cost increase.

Patent Document 1: Japanese Patent Application publication No. 2004-303614 (pages 5-7, FIGS. 1 and 2)

Patent Document 2: Japanese Patent Application publication No. 2000-222915 (page 2, FIGS. 5 and 6)

DISCLOSURE OF THE INVENTION

Problems to be Solved by the Invention

An object of the present invention is to provide an LED lighting lamp configured to enhance reliability and long-term stability and reduce cost involved in exchanging its light source.

Means for Solving Problems

To accomplish objects above, an LED lamp according to the present invention includes a lamp body having a light-emitting part and a connection part, and a socket in which the connection part of the lamp body is fitted. The light-emitting part of the lamp body is structured by arranging light-emitting-diode elements (hereinafter referred to as LED elements) on each of side surfaces of a polygonal column-shaped supporting member, and the connection part is provided at a position different from that of the light emitting part of the supporting member and includes terminal electrodes which are electrically connected to the LED elements. The socket includes output terminals, which are to be electrically connected to the terminal electrodes.

In one embodiment of the present invention, the terminal electrodes are provided on each of the side surfaces of the supporting member, all the terminal electrodes provided on their respective side surfaces being provided at the same corresponding positions in each end surface in an insertion direction of the connection part of the socket. In addition, the terminal electrodes comprise a cathode terminal electrode and an anode terminal electrode which are connected to a cathode electrode and an anode electrode of each LED element, respectively, the cathode terminal electrode and the anode terminal electrode being disposed at a mutually offset position in the insertion direction of the connection part of the socket.

Moreover, in one embodiment of the present invention, the socket is provided with a concave portion which has a polygonal cross-sectional shape similar to that of the supporting member, the connection part of the lamp body being detachably attachable in the concave portion, connection electrodes which are in contact with the terminal electrodes being provided on an inner peripheral surface of the concave portion, the connection electrodes being configured to be in electrical contact with the output terminals. In addition, the connection electrodes comprise a pair of band-shaped electrodes, one band-shaped electrode being in contact with all the cathode terminal electrodes provided on the side surfaces of the supporting member, and the other band-shaped electrode being in contact with all the anode terminal electrodes provided on the side surfaces of the supporting member.

Effect of the Invention

Because the LED lighting lamp according to the present invention includes the lamp body and the socket in which the lamp body is fitted, soldering of the light emitting diodes is not required, and a reflow process is therefore not required. Consequently, heat-induced damage of the light emitting diodes can be avoided, and reliability and long-term stability of the LED lighting lamp are enhanced. In addition, because there is no need to take heat-resistance into account, there arise the advantageous effects that the degree of freedom in selecting members is increased and selection of materials is made easier. Moreover, because there is no need to substitute entire fittings when exchanging a light source of the LED lighting lamp, a low exchange cost can be achieved.

BEST MODE FOR CARRYING OUT THE INVENTION

Preferred embodiments of the present invention will be described in detail below with reference to the accompanying drawings.

An LED lighting lamp according to one embodiment of the present invention includes a polygonal column-shaped supporting member 15 and a plurality of LED elements disposed on side surfaces of the supporting member, and terminal electrodes of the LED elements provided on one end of the supporting member can be detachably attachable in a socket. The LED lighting lamp is mounted on a motherboard by way of the socket or connected to an external socket directly linked to a power source. Thereby, it is possible to reduce cost of exchanging light sources. Hereinafter, specific embodiments of the present invention are described with reference to FIGS. 1 to 11.

Figure 1:
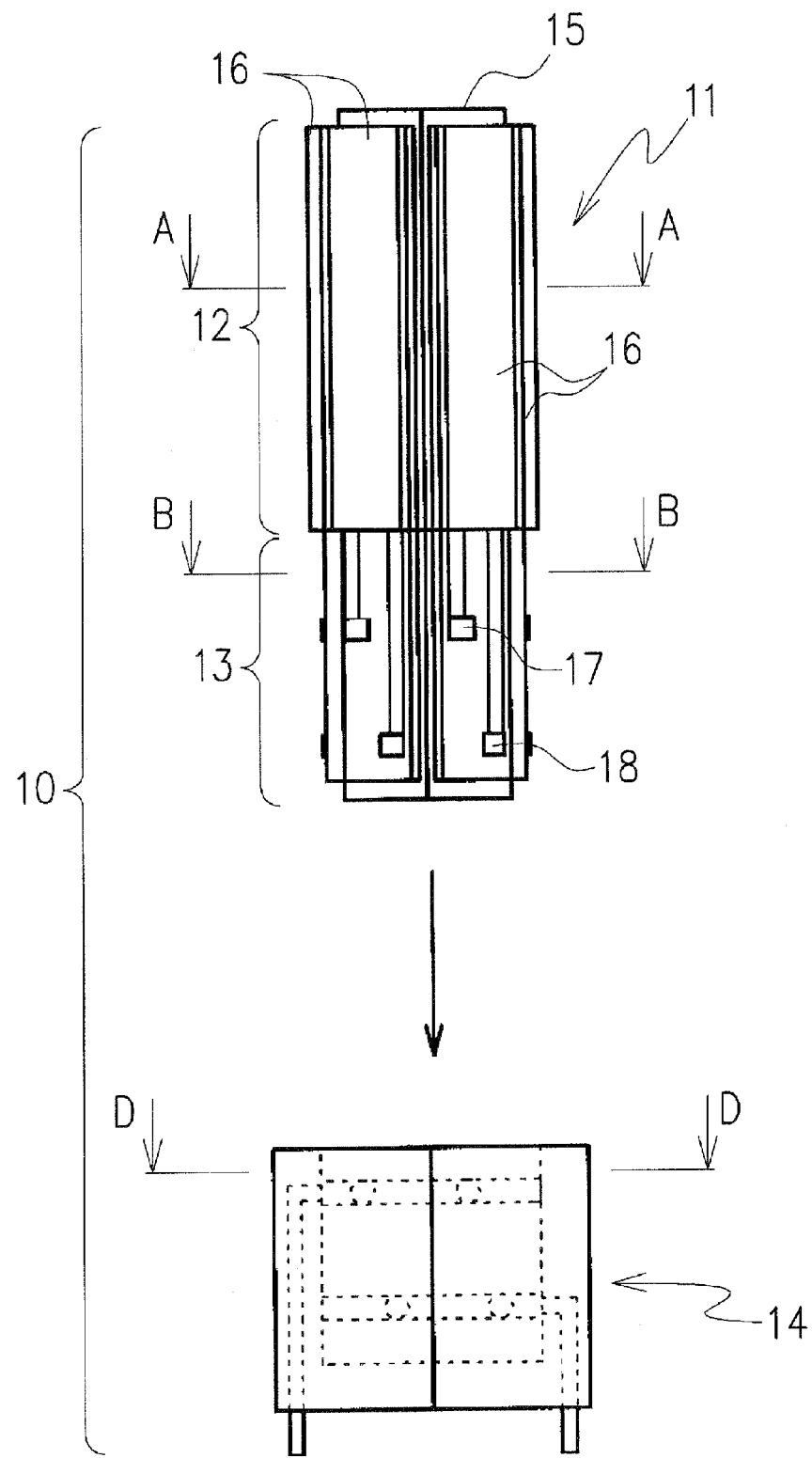
FIG. 1 is an exterior view showing one embodiment of an LED lighting lamp according to the present invention, with lamp body separated from socket.
Figure 2:
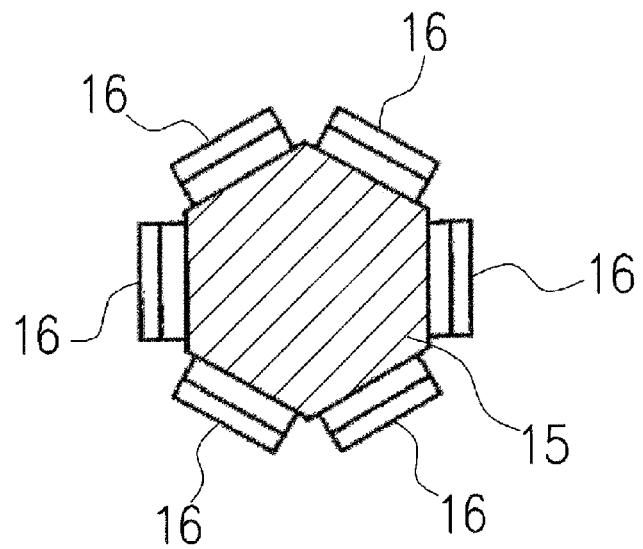
FIG. 2 is a sectional view taken along line A-A in FIG. 1.
Figure 3:
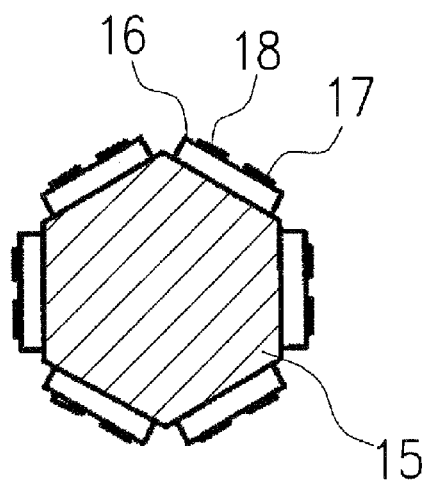
FIG. 3 is a sectional view taken along line B-B in FIG. 1.

One embodiment of LED lighting lamp according to the present invention is illustrated in FIGS. 1 to 3. As shown in FIG. 1, the LED lighting lamp 10 includes a lamp body 11 having a light emitting part 12 and a connection part 13, and a socket 14 in which the connection part 13 of the lamp body 11 is fitted. The light emitting part 12 of the lamp body 11 is structured such that an LED unit 16 is disposed on each of the side surfaces of the supporting member 15 which has a hexagonal columnar shape, as shown in FIGS. 2 and 3. The connection part 13 is provided on an end opposite to the light emitting part 12 having the polygonal side surfaces of the supporting member 15 in a height direction of the supporting member 15, and a pair of terminal electrodes 17 and 18 which are electrically connected to the plurality of LED elements arranged in each of the LED units 16 are provided on each LED unit 16. It should be noted that the supporting member 15 is made of a metallic material with high thermal conductivity such as aluminum or copper alloy or the like to facilitate release of heat generated from the LED elements.

Figure 4:
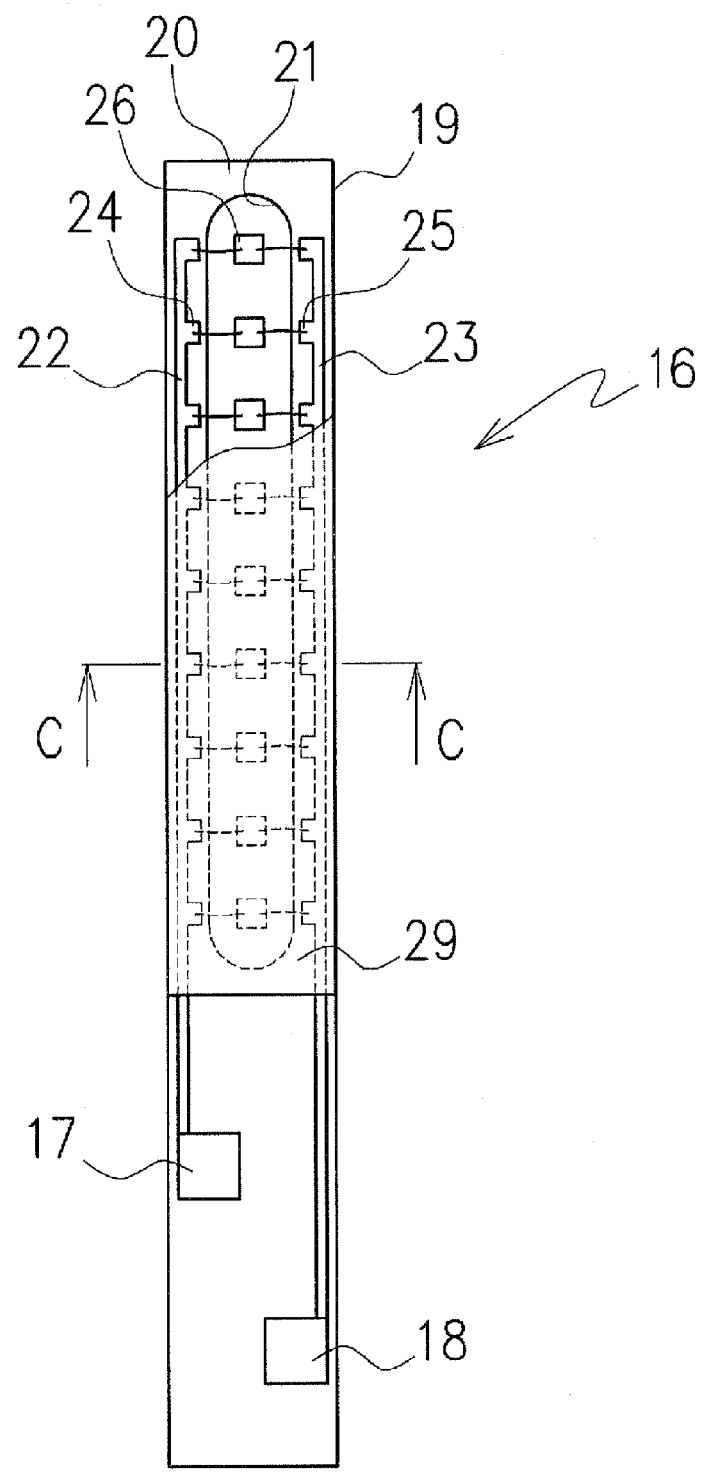
FIG. 4 is a front view showing one embodiment of LED unit installed on the lamp body.
Figure 5:
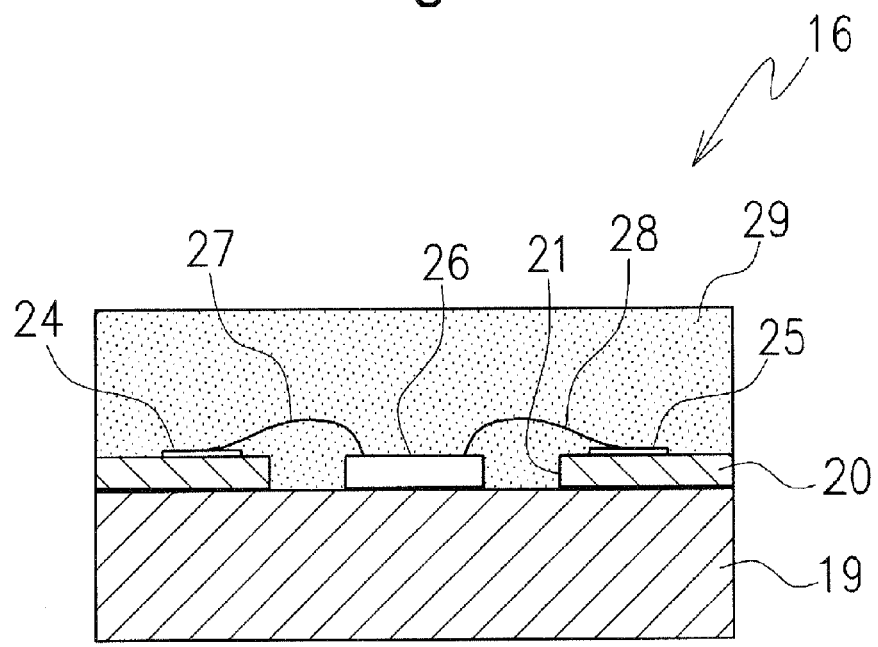
FIG. 5 is a sectional view taken along line C-C in FIG. 4.

In this embodiment, each of the LED units 16 includes an elongated base 19 with a rectangular cross-sectional shape, a circuit board 20 bonded on an upper surface of the base 19 and nine LED elements 26 arranged at uniform intervals along a longitudinal direction of the base 19, as shown in FIGS. 4 and 5. The base 19 is made of, for example, a metallic material with high thermal conductivity such as a copper alloy or the like. The circuit board 20 is comprised of, for example, a flexible board, glass epoxy board or the like. It should be noted that, because the base 19 is disposed under the circuit board 20, it is possible to reduce the thickness of the circuit board.

An elongated hole 21, which is disposed to pass through the circuit board 20 along a longitudinal direction of the base 19, is provided in a central portion of the circuit board 20. Wiring patterns 22 and 23 extending along both sides of the hole 21 are provided on an upper surface of the circuit board 20, a plurality (nine in this embodiment) of inner connecting electrodes 24 and 25 which are connected to the wiring patterns 22 and 23, respectively are provided at regular intervals.

The wiring patterns 22 and 23 extend to one end of the circuit board 20, with each of the pair of terminal electrodes 17 and 18 being provided on a leading end of each of the wiring patterns. The terminal electrodes are comprised of a cathode terminal electrode 17 and an anode terminal electrode 18 which are connected to a cathode electrode and an anode electrode of each LED element 26, respectively. The cathode terminal electrode 17 and the anode terminal electrode 18 are disposed at a mutually offset position in an insertion direction of the connection part 13 in the socket, that is to say, in a longitudinal direction of the base 19 or a height direction of the supporting member 15.

The plurality of LED elements 26 are arranged on the upper surface of the base 19 exposed in an inner portion of the hole 21 provided in the circuit board 20, fixed on the upper surface of the base 19 by a silver paste, and connected by thin metallic wires 27 and 28 to the inner connecting electrodes 24 and 25, respectively. The LED elements 26, the wiring patterns 22 and 23, and the thin metallic wires 27 and 28 are sealed by a light-transmitting resinous body 29 made of epoxy resin, silicone resin or the like. It should be noted that the cathode terminal electrode 17 and the anode terminal electrode 18 which are provided at one end portion of the circuit board 20 are in a state such that they are exposed from the resinous body 29, and that the one end portion forms the connection part 13 of the lamp body 11 when the LED units 16 are disposed on the supporting member 15.

When a drive voltage is applied to the cathode terminal electrode 17 and the anode terminal electrode 18 of the LED unit 16 structured as mentioned above, all nine LED elements 26 are lit up by way of the wiring patterns 22 and 23, and the light is emitted, passing through the resinous body 29. Because lower surfaces of the LED elements 26 are in close contact with the base 19 which has high thermal conductivity, heat generated in the LED elements 26 is efficiently released through the base 19.

Figure 6:
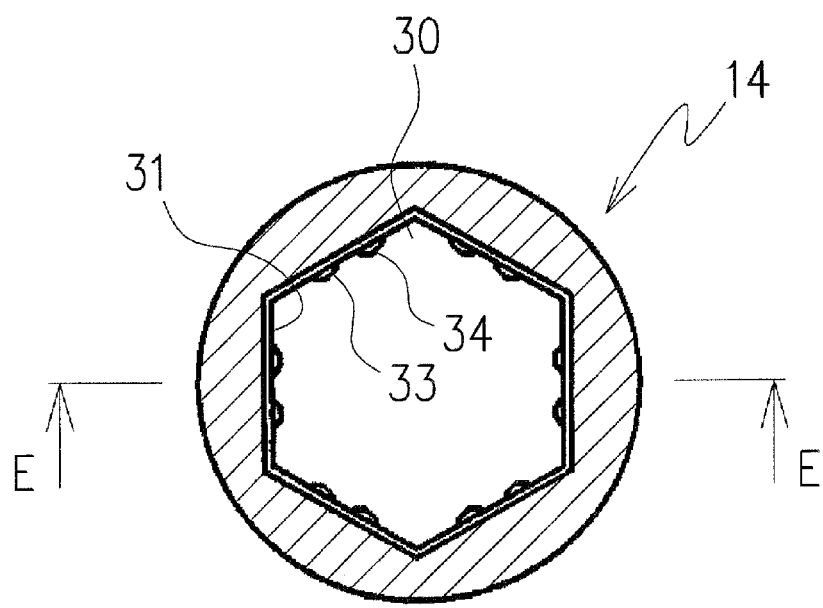
FIG. 6 is a sectional view taken along line D-D in FIG. 1.
Figure 7:
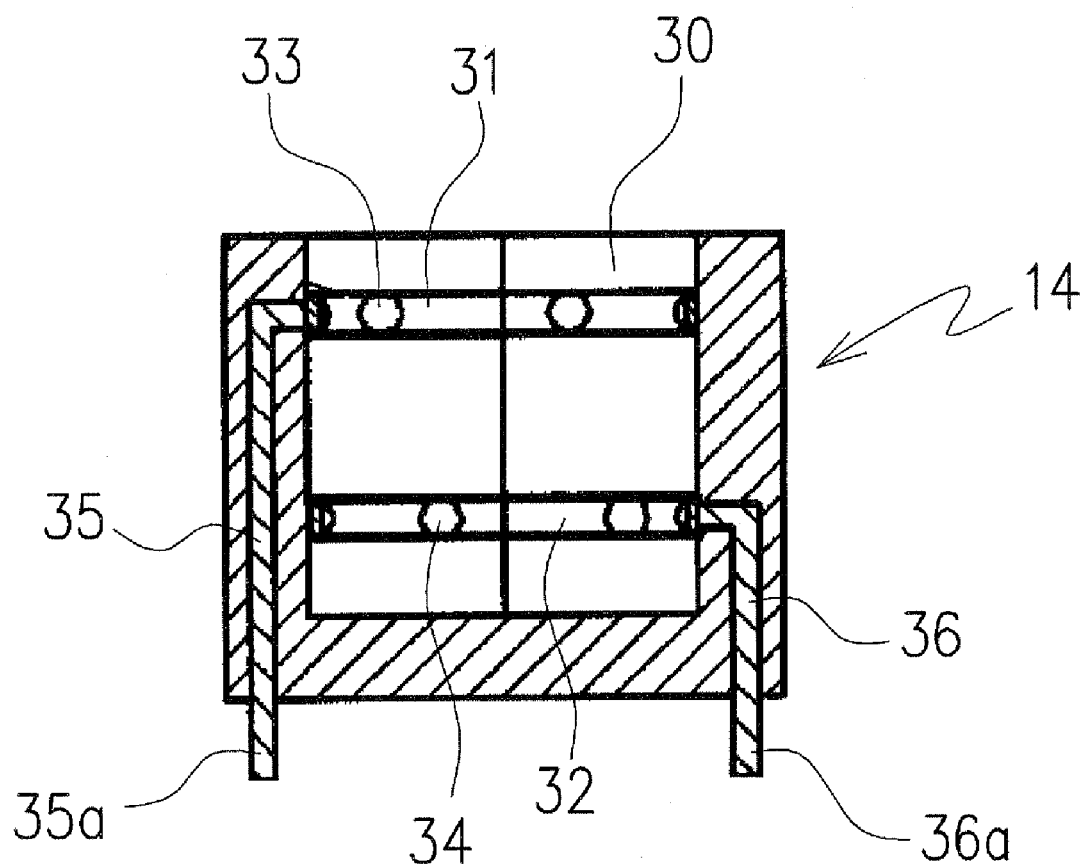
FIG. 7 is a sectional view taken along line E-E in FIG. 6.

The socket 14 is formed in a cylindrical shape by a resinous material, as shown in FIGS. 6 and 7. A concave portion 30 of hexagonal cross-section in which the connection part 13 of the lamp body 11 is detachably attachable is formed in an upper surface of the socket 14, and leading end portions 35a and 36a of a pair of output terminals 35 and 36 project from a lower surface of the socket. A pair of external connection electrodes which make electrical connection with the cathode terminal electrode 17 and the anode terminal electrode 18 provided on each unit of the connection part 13 of the lamp body 11 are provided on an inner peripheral surface of the concave portion 30. The external connection electrodes are comprised of a pair of band-shaped electrodes 31 and 32 provided along the inner peripheral surface of the concave portion 30, the pair of band-shaped electrodes 31 and 32 being disposed at a predetermined interval, corresponding to the position in which the cathode terminal electrodes 17 and the anode terminal electrodes 18 have been set. Because the band-shaped electrodes 31 and 32 are in contact with the cathode terminal electrodes 17 and the anode terminal electrodes 18 of all six LED units 16 mounted on the side surfaces of the supporting member 15, they act as common electrodes for all the LED elements 26 arranged on each LED unit 16.

In addition, protrusions 33 and 34 configured to project toward a center of the concave portion 30 of the socket 14 are provided on the band-shaped electrodes 31 and 32. The protrusions 33 and 34 are provided at positions such that they come in contact with the terminal electrodes 17 and 18, respectively, when the connection part 13 of the lamp body 11 is fitted in the concave portion 30. More specifically, the protrusions 33 which are in contact with the cathode terminal electrodes 17 of the LED units 16 are formed on the one band-shaped electrode 31, and the protrusions 34 which are in contact with the anode terminal electrodes 18 of the LED units 16 are formed on the other band-shaped electrode 32. In this embodiment the protrusions 33 and 34 are structured to be semi-spherical in shape and to have suitable elasticity, and are formed at predetermined positions on the band-shaped electrodes 31 and 32 which are made of, for example, a metallic band-shaped material by an embossing process or the like.

The output terminals 35 and 36 are connected respectively to the band-shaped electrodes 31 and 32 at positions facing each other. The output terminals 35 and 36 pass through inner portions of a peripheral wall of the socket 14, the leading end portions 35a and 36a thereof projecting from the lower surface of the socket 14.

Figure 8:
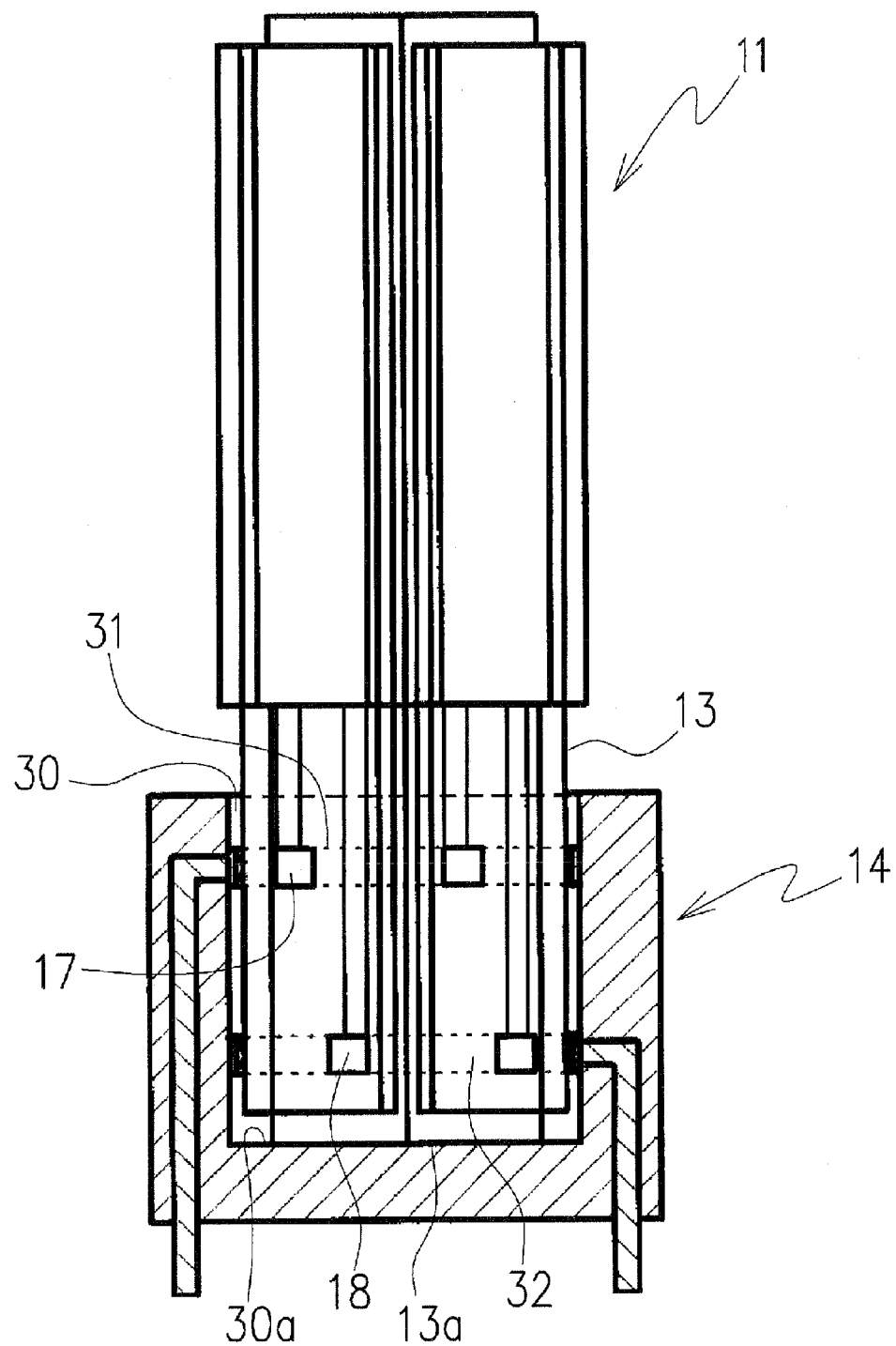
FIG. 8 is a partially sectional exterior view, with the lamp body fitted in the socket.

FIG. 8 illustrates a state where the connection part 13 of the lamp body 11 is fitted in the concave portion 30 of the socket 14. As shown in FIG. 8, by inserting a leading end 13a of the connection part 13 in the concave portion 30 until the leading end 13a is abutted with a bottom surface 30a of the concave portion 30, the protrusions 33 and 34 of the pair of band-shaped electrodes 31 and 32 provided on the inner peripheral surface of the concave portion 30 come in contact with and make electrical connection with the cathode terminal electrode 17 and the anode terminal electrode 18 provided on the side surfaces of the connection part 13. At this time, because the protrusions 33 and 34 as shown in FIG. 7 have suitable elasticity, a secure and stable electrical connection between the protrusions and the cathode and anode terminal electrodes is achieved. In this way, the LED lighting lamp 10 in this embodiment is configured to function additionally as a switch, whereby electrical turning ON and OFF can be achieved by insertion or removal of the connection part 13 of the lamp body 11 in or from the socket 14.

Figure 9:
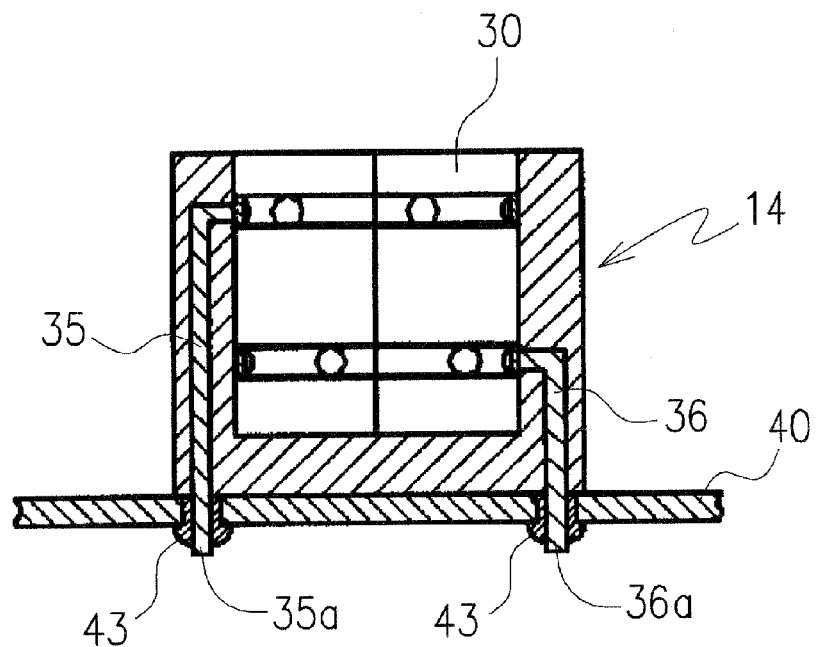
FIG. 9 is a sectional view of one embodiment in which the socket is mounted on a mother board by soldering.
Figure 10:
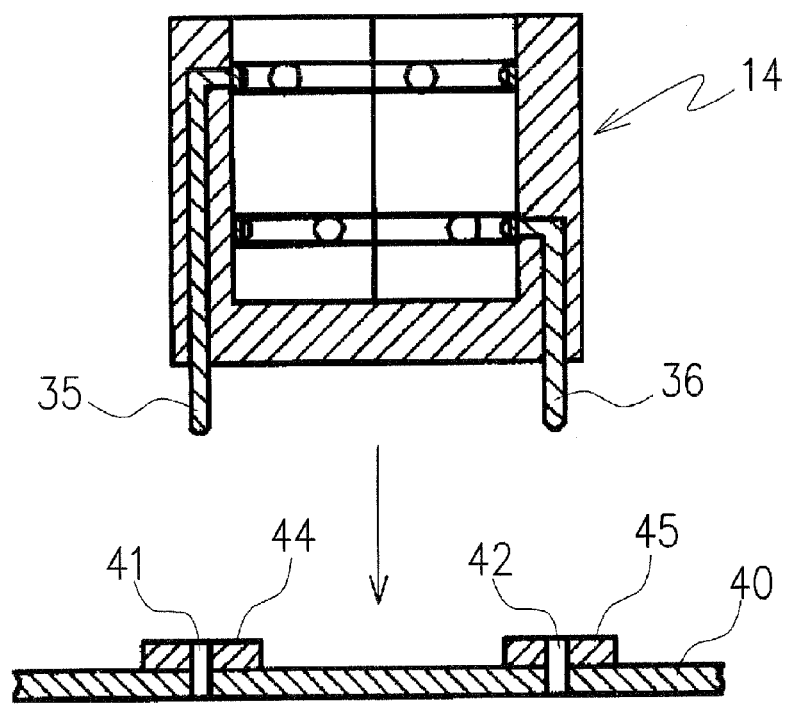
FIG. 10 is a sectional view of one embodiment in which the socket is removably mounted on a motherboard.
Figure 11:
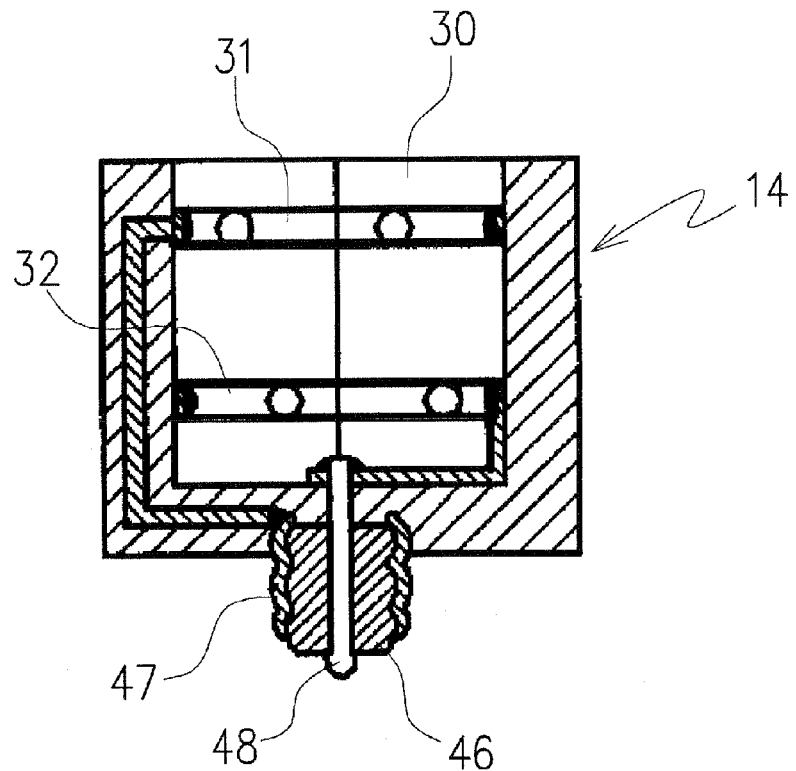
FIG. 11 is a sectional view of a socket with a cap.
Figure 12:
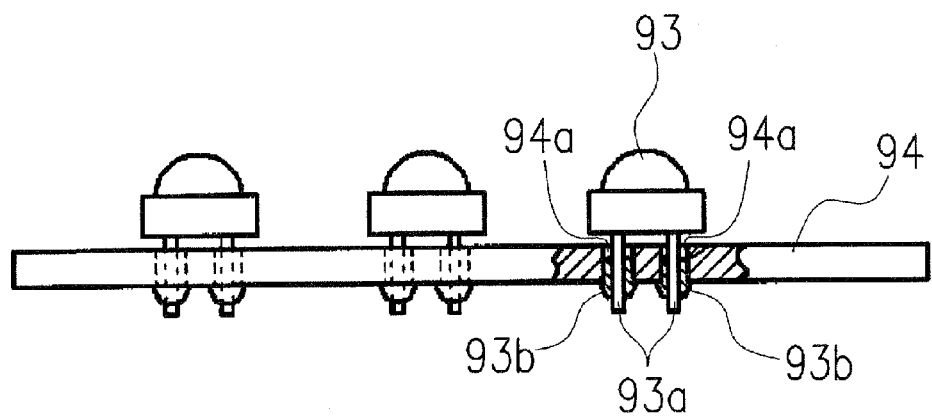
FIG. 12 is a view showing one example of a conventional fluorescent-lamp-shaped LED lamp.

One embodiment of a mounting method for a socket 14 on a motherboard 40 is shown in FIGS. 9 to 11. In the mounting method shown in FIG. 9, insertion holes to insert output terminals 35 and 36 of the socket 14 are provided in the mother board 40, and leading end portions 35a and 36a of the output terminals 35 and 36 of the socket 14 are inserted in the insertion holes and fixed by solders 43, thereby allowing the socket 14 to be mounted on the mother board 40 and the output terminals 35 and 36 to be connected to an electrical circuit wired on the mother board 40. Consequently, by fitting the connection part 13 of the lamp body 11 in the concave portion 30 of the socket 14 to be mounted on the motherboard 40, electricity is supplied to all LED elements 26 of the LED units 16 to light up.

In one embodiment of a mounting method shown in FIG. 10, reinforced pieces 44 and 45 are attached to upper peripheries of the insertion holes 41 and 42 provided in the mother board 40, and the output terminals 35 and 36 of the socket 14 can be electrically connected to the mother board 40 simply by fitting the output terminals in the insertion holes 41 and 42.

In addition, one embodiment of a mounting method in a case where a cap 46 is provided on the lower surface of the socket 14 is shown in FIG. 11. A pair of output terminals 47 and 48 which are connected to the band-shaped electrodes 31 and 32 of the socket 14 are provided on an outer peripheral surface and a central portion of the cap 46, and electrical connection can be achieved by inserting the cap 46 into another socket (not shown) connected to a power source or the like.

It should be noted that, in the above-mentioned embodiments, although a hexagonal supporting member 15 has been described, it is not limited to the hexagonal shape, and a supporting member of other polygonal shape such as a square shape, octagonal shape or the like can be used.

Moreover, in the above-mentioned embodiments, although the case where the LED units 16 are arranged on the side surfaces of the supporting member 15 has been described, individual light emitting diodes may be arranged directly on the side surfaces of the supporting member to form a light emitting part, instead of using LED units 16.

Furthermore, in the above-mentioned embodiments, although the case where the semi-spherical protrusions 33, 34 are provided on the pair of band-shaped electrodes 31, 32 has been described, the protrusions are not limited to the semi-spherical shape, provided that they have a suitable elasticity.

In addition, it should be noted that, in the LED lighting lamp according to the present invention, various changes and modifications can be made to the above-mentioned preferred embodiments.

INDUSTRIAL APPLICABILITY

The LED lighting lamp according to the present invention may be widely used as an illumination light source for illumination devices in general, vehicle-mounted headlights or the like.

DESCRIPTION OF REFERENCE NUMBERS

10 LED lighting lamp
11 lamp body
12 light emitting part
13 connection part
14 socket
15 supporting member
16 LED unit
17 cathode terminal electrodes (terminal electrodes)
18 anode terminal electrodes (terminal electrodes)
19 base
20 circuit board
21 hole
22, 23 wiring patterns
24, 25 inner connecting electrodes
26 LED elements
27, 28 metallic thin wires
29 resinous body
30 concave portion
31, 32 band-shaped electrodes (external connecting electrodes)
33, 34 protrusions
35, 36 output terminals
40 mother board
41, 42 insertion holes
43 solder
44, 45 reinforced pieces
46 cap
47, 48 output terminals

The invention claimed is:
1. A light-emitting-diode lighting lamp, comprising:
a plurality of light-emitting diode elements arranged at each of side surfaces of a polygonal supporting member;
a pair of cathode and anode terminal electrodes disposed at one end portion of each of the side surfaces of the polygonal supporting member, the pair of cathode and anode terminal electrodes being electrically connected to the plurality of light-emitting-diode elements disposed at the corresponding each of the side surfaces of the polygonal supporting member; and a socket in which the one end portion of each of the side surfaces is inserted, the socket being detachably attachable to the one end portion of the side surfaces and having a pair of output terminals electrically connected to the pair of cathode and anode terminal electrodes at the one end portion of each of the side surfaces, the pair of cathode and anode terminal electrodes at the one end portion of each of the side surfaces being disposed at mutually shifted positions in a direction that the one end portion of each of the side surfaces is inserted in the socket.

2. The light-emitting-diode lighting lamp according to claim 1, wherein the light-emitting diode elements arranged at each of the side surfaces are disposed in a light-emitting-diode unit on each of the side surfaces of the supporting member, and each of the light-emitting-diode units includes a base on which the plurality of light-emitting-diode elements are arranged and a light transmitting resinous body which seals the light-emitting-diode elements.

3. The light-emitting-diode lighting lamp according to claim 1, wherein a concave portion which is formed in the socket has a polygonal-cross-sectional shape similar to that of the supporting member and the one end portion of each of the side surfaces is detachably attachable in the concave portion, wherein the pair of output terminals further comprises external connection electrodes, and the external connection electrodes are provided on an inner peripheral surface of the concave portion.

4. The light-emitting-diode lighting lamp according to claim 3, wherein the external connection electrodes comprise a pair of band-shaped electrodes, and wherein one of the pair of band-shaped electrode is to be electrically in contact with all the cathode terminal electrodes provided at the side surfaces of the supporting member, and the other of the pair of band-shaped electrode is to be electrically in contact with all the anode terminal electrodes provided at the side surfaces of the supporting member.

5. The light-emitting-diode lighting lamp according to claim 3, wherein the external connection electrodes include protrusions configured to press on the pair of cathode and anode terminal electrodes disposed at one end portion of each of the side surfaces of the polygonal supporting member.

6. The light-emitting-diode lighting lamp according to claim 3, wherein the output terminals include a pair of leading end portions projecting to the exterior of the socket and electrically connected to the pair of cathode and anode terminal electrodes disposed at one end portion of each of the side surfaces of the polygonal supporting member, and wherein the leading end portions are to be fixed to a motherboard.

\* \* \* \* \*

UNITED STATES PATENT AND TRADEMARK OFFICE
CERTIFICATE OF CORRECTION

| | | |
|---|---|---|
| PATENT NO. | : 7,880,389 B2 | Page 1 of 1 |
| APPLICATION NO. | : 11/911595 | |
| DATED | : February 1, 2011 | |
| INVENTOR(S) | : Imai et al. | |

It is certified that error appears in the above-identified patent and that said Letters Patent is hereby corrected as shown below:

IN THE CLAIMS:
At column 8, line 6, claim 4, delete "electrode" and insert --electrodes--.

Signed and Sealed this
Twentieth Day of September, 2011

David J. Kappos
*Director of the United States Patent and Trademark Office*